(12) United States Patent
Oomori et al.

(10) Patent No.: US 11,133,644 B2
(45) Date of Patent: Sep. 28, 2021

(54) SEMICONDUCTOR LASER DEVICE

(71) Applicant: Panasonic Intellectual Property Management Co., Ltd., Osaka (JP)

(72) Inventors: Kouji Oomori, Shiga (JP); Teruaki Kasai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 5 days.

(21) Appl. No.: 16/726,296

(22) Filed: Dec. 24, 2019

(65) Prior Publication Data
US 2020/0136343 A1 Apr. 30, 2020

Related U.S. Application Data

(63) Continuation of application No. PCT/JP2018/023559, filed on Jun. 21, 2018.

(30) Foreign Application Priority Data

Jul. 7, 2017 (JP) .............................. JP2017-133760

(51) Int. Cl.
*H01S 5/024* (2006.01)
*H01S 5/042* (2006.01)
(Continued)

(52) U.S. Cl.
CPC ...... *H01S 5/02469* (2013.01); *H01S 5/02253* (2021.01); *H01S 5/02355* (2021.01);
(Continued)

(58) Field of Classification Search
CPC ............. H01S 5/02355; H01S 5/04256; H01S 5/04254; H01S 5/0425; H01S 5/02253; H01S 5/02469
See application file for complete search history.

(56) References Cited

U.S. PATENT DOCUMENTS

2002/0136250 A1\* 9/2002 Roellig ................... H01S 5/024
372/36
2002/0149861 A1 10/2002 Yonemura
(Continued)

FOREIGN PATENT DOCUMENTS

JP 2002-314011 10/2002
JP 2002-328268 11/2002
(Continued)

OTHER PUBLICATIONS

International Search Report of PCT application No. PCT/JP2018/023559 dated Sep. 18, 2018.

*Primary Examiner* — Tod T Van Roy
(74) *Attorney, Agent, or Firm* — Wenderoth, Lind & Ponack, L.L.P.

(57) ABSTRACT

Semiconductor laser device (1) includes lower electrode block (10) that has a first terminal hole and first and second connection holes, upper electrode block (60) that has third connection holes communicating with the respective first connection holes and a second terminal hole, heat sink (110) that has fourth connection holes communicating with the respective second connection holes, and optical component (100) attached to upper electrode block (60). The first and the second connection holes are formed on both side of a recess that is formed to house a submount on which a semiconductor laser element is disposed. Lower electrode block (10) is disposed on heat sink (110). Lower electrode block (10) and upper electrode block (60) are fastened together with first fasteners (90, 90), whereas lower electrode block (10) and heat sink (110) are fastened together with second fasteners (91, 91).

6 Claims, 8 Drawing Sheets

(51) Int. Cl.
*H01S 5/02355* (2021.01)
*H01S 5/02253* (2021.01)
*H01S 5/00* (2006.01)
*H01S 5/02365* (2021.01)

(52) U.S. Cl.
CPC ...... *H01S 5/02476* (2013.01); *H01S 5/04256* (2019.08); *H01S 5/005* (2013.01); *H01S 5/02365* (2021.01)

(56) References Cited

U.S. PATENT DOCUMENTS

| | | | |
|---|---|---|---|
| 2004/0258124 | A1* | 12/2004 | Lissotschenko .... H01S 5/02326 372/75 |
| 2017/0288365 | A1 | 10/2017 | Motofuji et al. |
| 2017/0301604 | A1* | 10/2017 | Ueda ....................... H01L 23/13 |

FOREIGN PATENT DOCUMENTS

| | | |
|---|---|---|
| JP | 2004-200634 | 7/2004 |
| JP | 2009-076592 | 4/2009 |
| JP | 2012-180820 | 9/2012 |
| WO | 2016/063436 | 4/2016 |
| WO | 2016/103536 | 6/2016 |

\* cited by examiner

SEMICONDUCTOR LASER DEVICE

This application is a continuation of the PCT International Application No. PCT/JP2018/023559 filed on Jun. 21, 2018, which claims the benefit of foreign priority of Japanese patent application No. 2017-133760 filed on Jul. 7, 2017, the contents all of which are incorporated herein by reference.

TECHNICAL FIELD

A technique disclosed herein relates to semiconductor laser devices and particularly to a semiconductor laser device in which a lens or another optical component is attached to an electrode block.

BACKGROUND ART

In recent years, demand for metal working using laser light has been growing. Laser devices with higher output have been required, and semiconductor laser devices that include semiconductor laser elements with high light-electricity conversion efficiency have received attention. Along with an increase in power output from a semiconductor laser device, the amount of electricity flowing through a semiconductor laser element increases, resulting in a rise in temperature of the semiconductor laser element due to Joule heat. This may cause a degradation in the performance of the semiconductor laser element and deterioration or other faults in the semiconductor laser element.

A semiconductor laser device according to conventional art includes a semiconductor laser element and a submount that are put between upper and lower electrode blocks and presents a structure for discharging heat generated from the semiconductor laser element through the electrode blocks. PTL 1 discloses a semiconductor laser device that includes a first electrode block on which a semiconductor laser element and a submount are disposed and a second electrode block disposed so as to cover the semiconductor laser element and the submount from above. Screws are inserted in screw holes formed in the electrode blocks and are tightened to integrate the electrode blocks together.

Laser light emitted from the semiconductor laser element forms an elliptical shape on a light-irradiated surface. The form of laser light needs to be shaped to reduce a diameter of the laser light and improve machining accuracy. PTL 2 discloses a structure of a semiconductor laser device in which a lens unit used to adjust an optical axis of laser light and shape a form of the laser light is attached to an upper electrode block.

CITATION LIST

Patent Literature

PTL 1: International Publication No. WO 2016/103536
PTL 2: International Publication No. WO 2016/063436

SUMMARY OF THE INVENTION

Technical Problem

Generally, in a semiconductor laser device, a semiconductor laser element and a submount are disposed on a heat sink to improve cooling efficiency.

However, if parts of the structure disclosed in PTL 2 are attached to a heat sink and these parts are fastened together by a method disclosed, for example, in PTL 1, the heat sink and electrode blocks may deviate in position relatively from one another depending on a way of tightening screws. In such a case, laser light cannot be shaped into a desired form due to a shift of an optical axis adjusted between a light emitting point of a semiconductor laser element and an optical component (lens unit) or a change in distance between the semiconductor laser element and the optical component.

The technique disclosed herein has been accomplished in view of the problem, and it is an object of the disclosure to prevent positional deviation between a semiconductor laser element and an optical component that are attached individually to upper and lower electrode blocks in a structure of a semiconductor laser device including the semiconductor laser element and a submount that are put between the upper and the lower electrode blocks.

Solution to Problem

In order to accomplish the object described above, a semiconductor laser device according to the technique disclosed herein includes a semiconductor laser element to emit laser light, a submount electrically connected with the semiconductor laser element disposed on an upper surface of the submount, a lower electrode block that is disposed below the submount and that is electrically connected with the submount, and an upper electrode block disposed over the lower electrode block so as to cover the submount and the semiconductor laser element. The submount is made of a conductive material. The lower electrode block has a submount disposition space to allow the submount to be disposed on an upper surface of the lower electrode block. The lower electrode block includes at least a pair of first connection holes formed on both sides of the submount disposition space, a pair of second connection holes formed on both sides of the submount disposition space so as to be separated from the first connection holes, and a first terminal hole formed so as to be separated from the submount disposition space and the first and the second connection holes. The upper electrode block includes a pair of third connection holes communicating with the respective first connection holes, and a second terminal hole formed so as to be separated from the third connection holes. The upper electrode block is electrically connected with the semiconductor laser element and is electrically insulated from the lower electrode block. The semiconductor laser device further includes a heat sink having a pair of fourth connection holes communicating with the respective second connection holes and an optical component attached to the upper electrode block. The lower electrode block is disposed on an upper surface of the heat sink. The optical component is configured to receive the laser light from the semiconductor laser element. The lower electrode block and the upper electrode block are fastened together with a pair of first fasteners inserted into the first and the third connection holes. The lower electrode block and the heat sink are fastened together with a pair of second fasteners inserted into the second and the fourth connection holes.

In this configuration, the first and the third connection holes into which the first fasteners are inserted to fasten the upper electrode block to the lower electrode block and the second and the fourth connection holes into which the second fasteners are inserted to fasten the lower electrode block to the heat sink are disposed separately. This prevents the heat sink and the upper and the lower electrode blocks from deviating in position from one another when the semiconductor laser device is assembled. This prevents positional deviation between the semiconductor laser element and the optical component.

It is preferred that each of the first fasteners be a screw made of an insulating material and that each of the first connection holes be a screw hole into which each of the first fasteners is screwed.

This configuration enables the upper electrode block and the lower electrode block to be reliably fastened together. This configuration also avoids electrical connection between the upper electrode block and the lower electrode block through the first fasteners.

It is preferred that each of the second fasteners be a screw made of a metallic material, that each of the fourth connection holes be a screw hole into which each of the second fasteners is screwed, and that each of the second fasteners be electrically insulated from the lower electrode block with an insulating member.

Since the second fasteners are screws made of a metallic material, this configuration provides increased fastening strength between the heat sink and the lower electrode block. The insulating member electrically insulates each of the second fasteners from the lower electrode block.

Preferably, the semiconductor laser device further includes a third fastener made of a conductive material. The third fastener is inserted into each of the first and the second terminal holes and is tightened to electrically connect external terminals used to supply electric power to the semiconductor laser element with the lower electrode block and the upper electrode block, respectively.

This configuration reliably enables the supply of electric power to the semiconductor laser element.

It is preferred that the third fastener be a screw and that each of the first and the second terminal holes be a screw hole into which the third fastener is screwed.

This configuration enables the external terminals and the respective electrode blocks to be reliably fastened together.

Preferably, the semiconductor laser device includes three of the first connection holes that are made up of the pair of the first connection holes formed at respective places on both sides of the submount disposition space and another first connection hole formed at a place on a side opposite to a side from which the laser light is emitted so as to be separated from the submount disposition space. Preferably, the first terminal hole is disposed in a vicinity of a barycenter of a triangle joining the three of the first connection holes in a top view.

According to this configuration, the lower electrode block and the upper electrode block are less likely to deviate in position from each other when the two blocks are fastened together. This allows a position of the optical component to be readily adjusted when the optical component is attached to the upper electrode block.

Preferably, the submount disposition space is a cutout recess that is opened in a direction along which the laser light is emitted.

A lower surface of the upper electrode block may have a recess to house the submount and the semiconductor laser element.

Advantageous Effect of Invention

A semiconductor laser device according to the present disclosure is able to prevent positional deviation between an optical component attached to an upper electrode block and a semiconductor laser element attached to a lower electrode block.

DESCRIPTION OF EMBODIMENTS

Exemplary embodiments of the present disclosure will be described in detail below with reference to the drawings. The following description of preferred exemplary embodiments is merely illustrative in nature and is in no way intended to limit the scope of the present disclosure and its application or uses.

Exemplary Embodiment

[Configuration of Semiconductor Laser Device]

Figure 1:
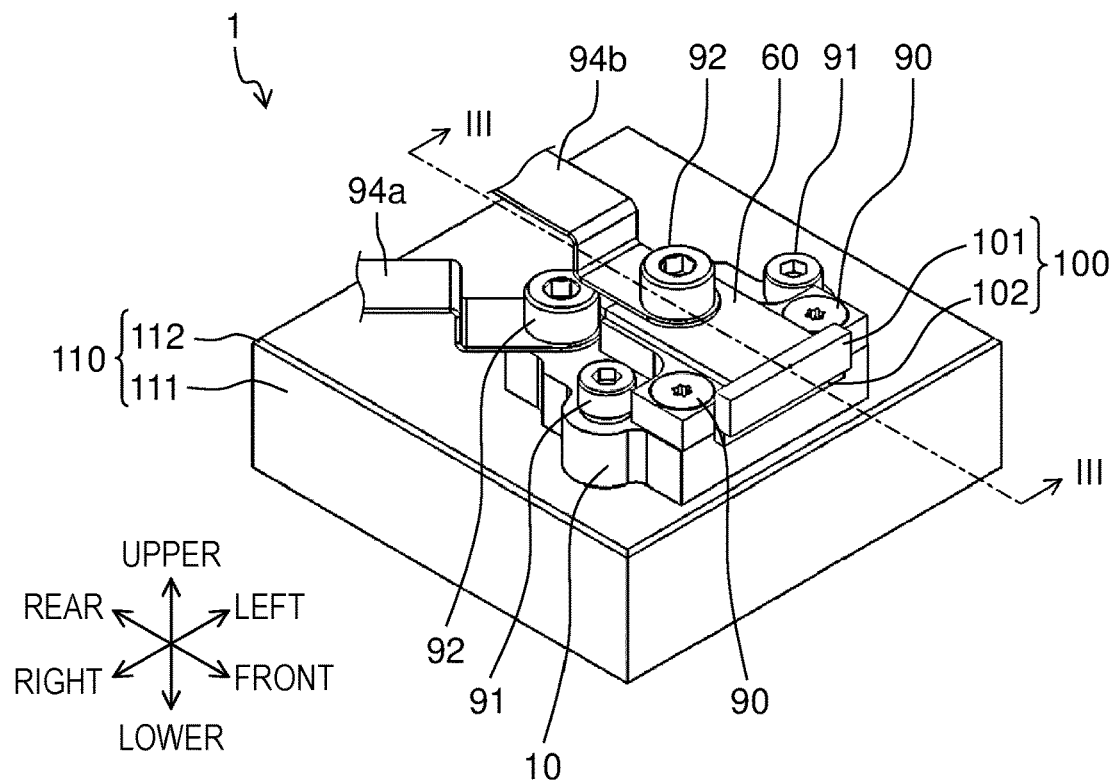
FIG. 1 is a perspective view showing a configuration of a semiconductor laser device according to an exemplary embodiment.
Figure 2:
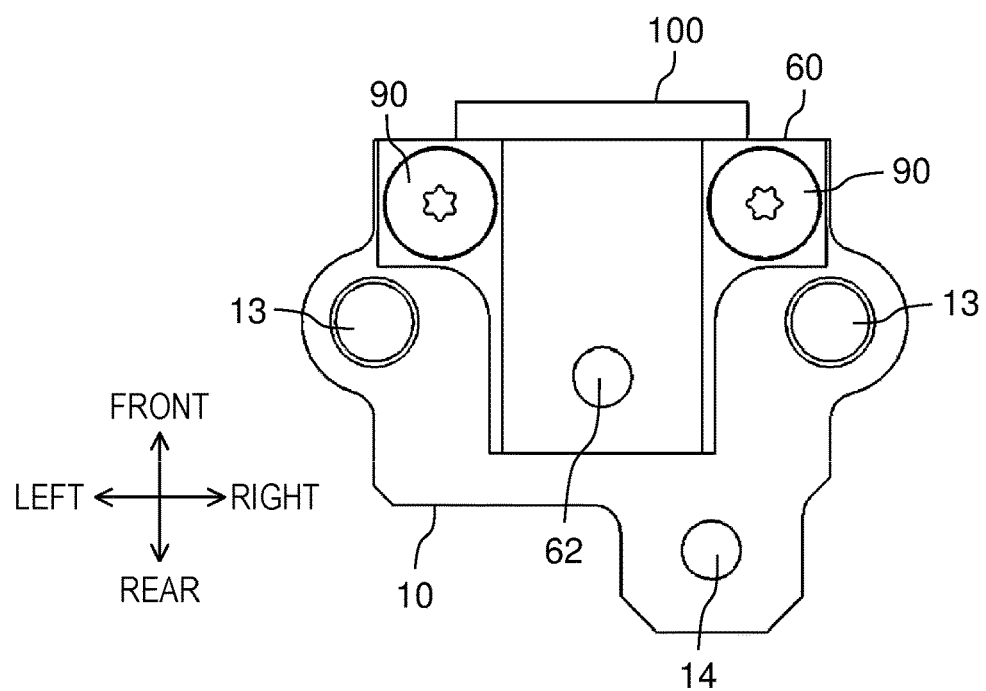
FIG. 2 is a top view showing the configuration of the semiconductor laser device according to the exemplary embodiment.
Figure 3:
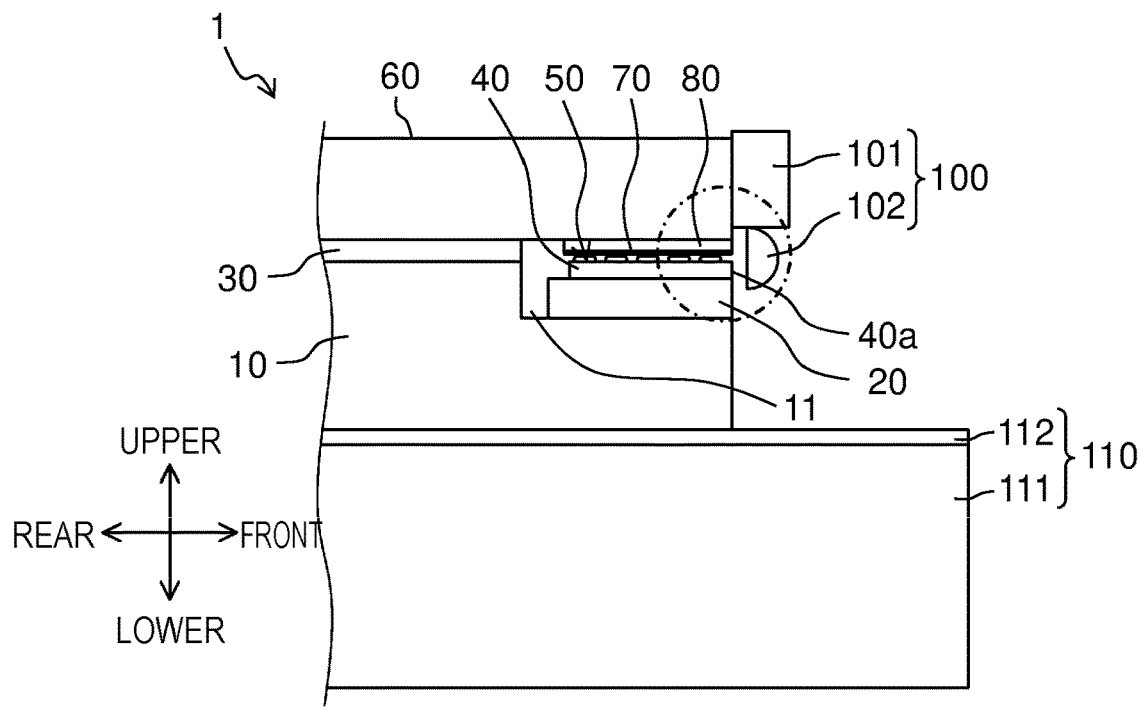
FIG. 3 is a cross-sectional view taken along line III-III of FIG. 1.
Figure 4:
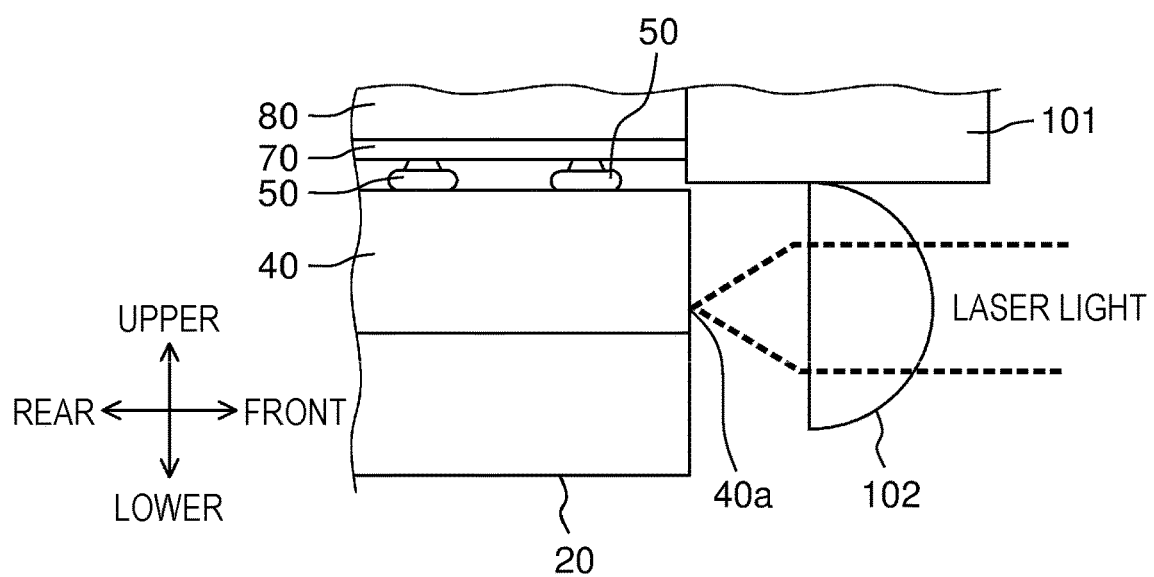
FIG. 4 is an enlarged cross-sectional view of a part surrounded by a dot-and-dash line in FIG. 3.

FIGS. 1 and 2 is a perspective view and a top view showing a configuration of a semiconductor laser device according to the present exemplary embodiment. FIG. 3 shows a cross section taken along line III-III of FIG. 1. FIG. 4 shows an enlarged cross section of a part surrounded by a dot-and-dash line in FIG. 3. FIGS. 5A to 5G are drawings illustrating a method for assembling the semiconductor laser device. In FIGS. 2 to 4, illustration of heat sink 110, fasteners 91, 91 and 92, 92, and external terminals 94*a*, 94*b* is omitted for explanatory convenience.

Semiconductor laser device 1 includes heat sink 110, lower electrode block 10, submount 20, semiconductor laser element 40, upper electrode block 60, and lens unit 100 (an optical component). In the following description, a side of semiconductor laser device 1 on which heat sink 110 is disposed may be referred to as "lower", whereas a side on which upper electrode block 60 is disposed may be referred to as "upper". A side of semiconductor laser element 40 adjacent to laser emitting edge 40*a* may be referred to as "front", whereas a side remote from the laser emitting edge may be referred to as "rear". In semiconductor laser device 1, a direction that intersects with both the upper-lower direction and the front-rear direction described above may be referred to as a left-right direction.

Heat sink 110 includes metal block 111 made of copper and insulating layer 112 disposed on an upper surface of metal block 111. Heat sink 110 has connection holes 113, 113 (a fourth connection hole) (see FIG. 5F) passing through insulating layer 112 and extending into metal block 111. Connection holes 113, 113 are each a screw hole having a bottom surface inside metal block 111. A thread (not shown) is formed on an inner surface of the screw hole. A material of which metal block 111 is made is not particularly limited to copper. Another metallic material or an insulating material may be used with proviso that the material has high thermal conductivity and high corrosion resistance. If the material is an insulating material, insulating layer 112 may be omitted. Metal block 111 may have a flow path inside to allow a flow of a refrigerant.

Lower electrode block 10 is disposed on an upper surface of heat sink 110, i.e., insulating layer 112. Lower electrode block 10 is a thick plate-shaped member made of a conductive material. The lower electrode block is, for example, produced by plating a copper (Cu)-made board with nickel (Ni) and gold (Au) in this order. Insulating layer 112 is used to electrically insulate metal block 111 and lower electrode block 10 from each other. An upper surface and a front surface of lower electrode block 10 are partly cut out and opened to form cutout recess 11 (see FIG. 5A) (hereinafter simply referred to as recess 11). Recess 11 is a submount disposition space where submount 20 and semiconductor laser element 40 are housed. Laser light is emitted from semiconductor laser element 40 through a front opening of recess 11. Lower electrode block 10 has one connection hole 12, 12 (a first connection hole) that is formed at a place on each of right and left sides of recess 11 so as to be separated from recess 11. Lower electrode block 10 also has one connection hole 13, 13 (a second connection hole) that is formed at a place on each of right and left sides of recess 11 and rearward of connection holes 12, 12 so as to be separated from connection holes 12, 12. Further, lower electrode block 10 has terminal hole 14 (a first terminal hole) (see FIGS. 5A and 5B) that is formed rearward of recess 11. Of these holes, connection holes 13, 13 are formed so as to communicate with respective connection holes 113, 113 formed in heat sink 110 when lower electrode block 10 is attached to heat sink 110. Portions of lower electrode block 10 where connection holes 13, 13 are formed protrude left and right, and a portion where terminal hole 14 is formed protrudes rearward. Connection holes 12, 12 and terminal hole 14 each have a bottom surface (not shown) inside lower electrode block 10. Connection holes 13, 13 pass through lower electrode block 10. Connection holes 12, 12 and terminal hole 14 are each a screw hole in which a thread (not shown) is formed on an inner surface. No thread is formed on an inner surface of each connection hole 13, 13.

Insulating layer 30 (see FIG. 5C) is disposed on the upper surface of lower electrode block 10 so as to surround recess 11. As described later, insulating layer 30 has a function of electrically insulating lower electrode block 10 and upper electrode block 60 from each other. Insulating layer 30 is, for example, made of an insulating material such as polyimide or ceramics. In the present exemplary embodiment, insulating layer 30 includes two parts, i.e., insulating layer 31 and insulating layer 32 (see FIG. 5C). Insulating layer 31 is made of a material containing polyimide. Insulating layer 32 is made of a material containing aluminum nitride (AlN). However, these layers may be made of an identical material or may be one contiguous part.

Submount 20 is, for example, made of a conductive material such as copper-tungsten (Cu:W). As shown in FIG. 3, submount 20 is disposed in recess 11 such that the front surface of lower electrode block 10 and a front surface of submount 20 are substantially flush with each other. Submount 20 and lower electrode block 10 are bonded to each other by a soldering material (not shown) and are electrically connected. The soldering material, for example, contains 96.5% tin (Sn) and 3.5% silver (Ag).

Semiconductor laser element 40 is a semiconductor laser element of an edge-emitting type. Semiconductor laser element 40 includes a lower electrode on a lower surface and an upper electrode on an upper surface (all not shown). The lower electrode is disposed over an upper surface of submount 20 with gold-tin (Au—Sn) solder or the like (not shown) interposed therebetween. In other words, the lower electrode is electrically connected with submount 20. The lower electrode of semiconductor laser element 40 may be in direct contact with the upper surface of submount 20. A plurality of bumps 50 is disposed on an upper surface of the upper electrode (see FIGS. 3 and 4). A resonator (not shown) of semiconductor laser element 40 is formed so as to extend in the front-rear direction. A front surface of semiconductor laser element 40 is equivalent to laser emitting edge 40a. Semiconductor laser element 40 is disposed over submount 20 such that laser emitting edge 40a and the front surface of submount 20 are substantially flush with each other. In the present exemplary embodiment, the lower electrode is a positive electrode (+) and the upper electrode is a negative electrode (−). However, these polarities may be reversed. Semiconductor laser element 40 may include a plurality of resonators. For instance, the semiconductor laser element may have a plurality of resonators that are disposed at intervals in a direction perpendicular to a drawing surface of FIG. 3.

Each bump 50 is, for example, a gold bump formed by melting a wire made of gold (Au). Since gold is softer than other metals, bumps 50 deform when semiconductor laser element 40 and upper electrode block 60 are connected together. This enables good electrical connection between semiconductor laser element 40 and upper electrode block 60 without causing substantial mechanical damage to both components. The material for bumps 50 may be any substance other than gold, with proviso that the substance has electrical conductivity and ensures electrical connection between the upper electrode of semiconductor laser element 40 and upper electrode block 60. As shown in FIGS. 3 and 4, metal sheet 70 such as gold leaf may be inserted between bumps 50 and upper electrode block 60. Inserted metal sheet 70 provides an increase in area of contact between bumps 50 and metal sheet 70 and a decrease in contact resistance between bumps 50 and upper electrode block 60. Metal sheet 70 is not limited to gold leaf and may be a sheet made of another conductive material. A plurality of metal sheets 70 may be inserted between bumps 50 and upper electrode block 60. Metal sheet 70 may not be inserted with proviso that electrical connection between bumps 50 and upper electrode block 60 is satisfactorily good.

Upper electrode block 60 is disposed over the upper surface of lower electrode block 10 so as to cover recess 11, i.e., above the submount disposition space, with insulating layer 30 interposed between the electrode blocks. Upper electrode block 60 is a thick plate-shaped member made of a conductive material. Upper electrode block 60 is, for example, produced by plating a copper (Cu)-made board with nickel (Ni) and gold (Au) in this order. Upper electrode block 60 has connection holes 61, 61 (a third connection hole) at places that communicate with connection holes 12, 12 formed in lower electrode block 10. Upper electrode block 60 also has terminal hole 62 (a second terminal hole) (see FIGS. 2 and 5D) that is formed rearward of connection holes 61, 61 and on a line running between connection holes 61, 61 in a top view. A portion of upper electrode block 60 where terminal hole 62 is formed protrudes rearward. Terminal hole 62 has a bottom surface (not shown) inside upper electrode block 60. Connection holes 61, 61 pass through upper electrode block 60. Terminal hole 62 is a screw hole in which a thread (not shown) is formed on an inner surface. No thread is formed on an inner surface of each connection hole 61, 61.

Figure 5A:
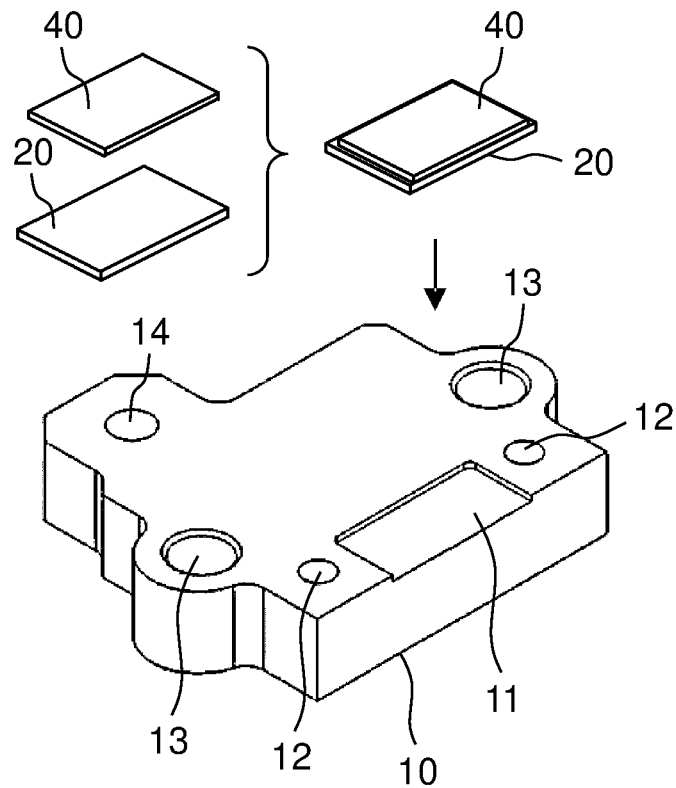
FIG. 5A is a drawing illustrating a step included in a method for assembling the semiconductor laser device.
Figure 5B:
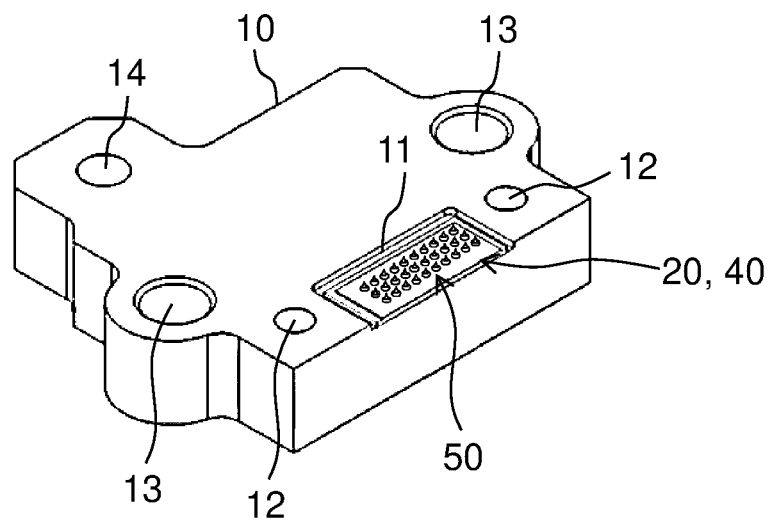
FIG. 5B is a drawing illustrating a step following the step in FIG. 5A.
Figure 5C:
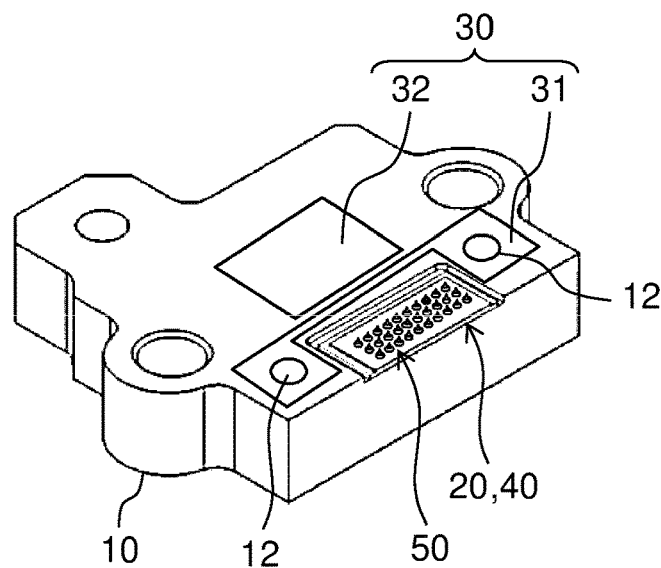
FIG. 5C is a drawing illustrating a step following the step in FIG. 5B.
Figure 5D:
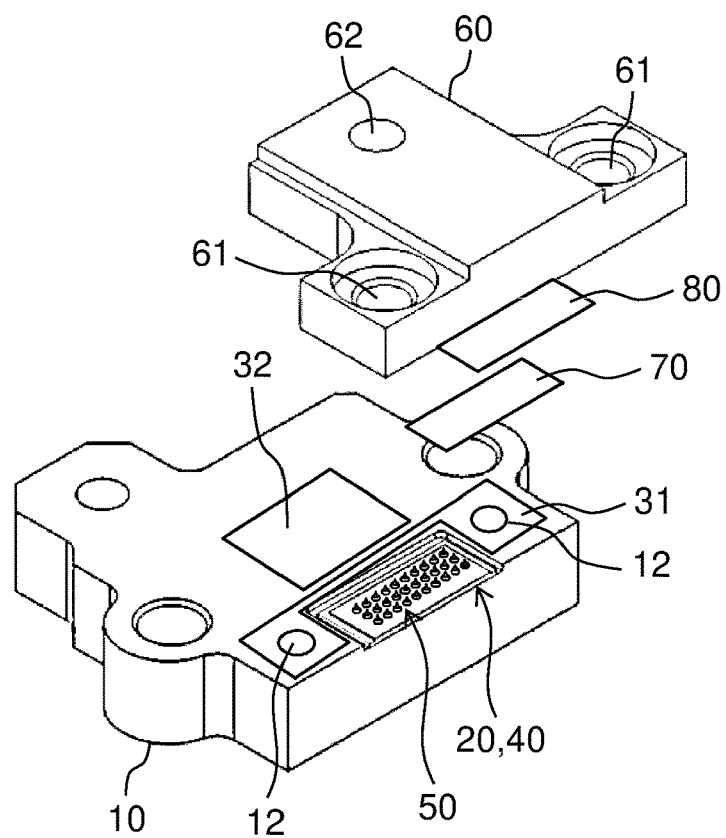
FIG. 5D is a drawing illustrating a step following the step in FIG. 5C.

A lower surface of upper electrode block 60 is provided with metal layer 80 at a place that covers recess 11 (see FIGS. 3, 4, and 5D). Metal layer 80 is put in contact with metal sheet 70 to electrically connect bumps 50 with upper electrode block 60 and is inserted along side surfaces of bumps 50 to perform a function of decreasing contact resistance between bumps 50 and upper electrode block 60. Metal layer 80 is preferably made of gold, but may be made of another metallic material. However, hardness and other properties of the metallic material need to be taken into consideration to prevent bumps 50 from being greatly deformed or being detached when upper electrode block 60 is attached to lower electrode block 10. Metal layer 80 may not be formed with proviso that electrical connection between bumps 50 and upper electrode block 60 is satisfactorily good.

Lens unit 100 is attached to a front surface of upper electrode block 60 and includes holding block 101 and lens 102 (see FIG. 3). Holding block 101 is, for example, a transparent member made of a quartz material and is bonded to the front surface of upper electrode block 60 through an ultraviolet-curable resin (not shown). Lens 102 is fixed to holding block 101. Lens unit 100 has a function of both adjusting an optical axis of laser light emitted from semiconductor laser element 40 and shaping a form of the laser light. A dispositional relationship between holding block 101 and lens 102 is determined in advance such that the optical axis and the form of laser light have a desired relationship when lens unit 100 is attached to upper electrode block 60. Holding block 101 may be, for example, made of another material such as a resin, with proviso that the material is transparent.

In order to efficiently cool semiconductor laser element 40, semiconductor laser element 40 is often mounted such that a light emitting point of semiconductor laser element 40 is on a side adjacent to submount 20. In such a case, heat largely flows into lower electrode block 10 located below semiconductor laser element 40, and temperature of lower electrode block 10 is likely to rise. If lens unit 100 is attached to lower electrode block 10, there is a risk that relative positions of lens 102 and semiconductor laser element 40 may change in response to thermal expansion or contraction of the material that makes up holding block 101. To avoid this risk, it is preferred that lens unit 100 be attached to upper electrode block 60 located above semiconductor laser element 40. A shape of lens 102 may be appropriately changed according to conditions such as a number of resonators in semiconductor laser element 40. If semiconductor laser element 40 is a multi-emitter type element having a plurality of resonators, lens 102 may be provided to suit individual light emitting points or may be a cylindrical lens extending along a direction in which light emitting points are arranged.

Semiconductor laser device 1 further includes fasteners 90 to 92. Fasteners 90, 90 (a first fastener) are, for example, screws made of an insulating material such as a resin. Upper electrode block 60 is attached to lower electrode block 10 such that connection holes 61, 61 in upper electrode block 60 communicate with connection holes 12, 12 in lower electrode block 10. Fasteners 90, 90 are inserted into connection holes 61, 61 of upper electrode block 60 and connection holes 12, 12 of lower electrode block 10 communicating with connection holes 61, 61. Fasteners 90, 90 are screwed into connection holes 12, 12, and lower electrode block 10 and upper electrode block 60 are thereby fastened together.

Fasteners 91, 91 (a second fastener) are, for example, screws made of a metallic material such as stainless steel. Lower electrode block 10 is attached to heat sink 110 such that connection holes 13, 13 in lower electrode block 10 communicate with connection holes 113, 113 in heat sink 110. Fasteners 91, 91 are inserted into connection holes 13, 13 of lower electrode block 10 and connection holes 113, 113 of heat sink 110 communicating with connection holes 13, 13. Fasteners 91, 91 are screwed into connection holes 113, 113, and heat sink 110 and lower electrode block 10 are thereby fastened together. Bushing 93, 93 (an insulating member) (see FIG. 5F) made of an insulating material is disposed between a head of each fastener 91, 91 and an upper part of each connection hole 13, 13 in lower electrode block 10. This electrically insulates lower electrode block 10 from fasteners 91, 91. Although no illustration is given in the figure, insulation treatment is applied to prevent conduction of electricity between heat sink 110 and lower electrode block 10 via fasteners 91, 91. For instance, insulation treatment may be applied to surfaces of fasteners 91, 91 or may be applied to inner faces of connection holes 13, 13 and connection holes 113, 113. The material of which fasteners 92 are made may be another material such as a ferrous material. However, strength of the material needs to be taken into consideration to firmly fasten heat sink 110 and lower electrode block 10 together.

Fasteners 92, 92 (a third fastener) are, for example, screws made of a conductive material such as stainless steel or another metallic material. One fastener 92 is inserted into a through-hole that is formed in a head of external terminal 94a for supplying electricity to semiconductor laser element 40 as well as into terminal hole 14 in lower electrode block 10, and is screwed into terminal hole 14. As a result, external terminal 94a and lower electrode block 10 are fastened together and electrically connected. Another fastener 92 is inserted into a through-hole formed in a head of external terminal 94b as well as into terminal hole 62 in upper electrode block 60, and is screwed into terminal hole 62. External terminal 94b and upper electrode block 60 are thereby fastened together and electrically connected.

[Method for Assembling Semiconductor Laser Device]

A method for assembling semiconductor laser device 1 will now be described with reference to the drawings.

Lower electrode block 10 and submount 20 to which semiconductor laser element 40 is joined are prepared (FIG. 5A). Lower electrode block 10 has recess 11, connection holes 12, 12, connection holes 13, 13, and terminal hole 14.

Semiconductor laser element 40 and submount 20 are disposed in recess 11 in lower electrode block 10, and a plurality of bumps 50 is formed on the upper electrode of semiconductor laser element 40 (FIG. 5B). A method for forming bumps 50 will now be described. For instance, while ultrasonic waves are given, a gold wire is joined to the upper electrode. By applying a predetermined degree of tension to the gold wire while ultrasonic waves are given, the gold wire is broken with a tip joined to the upper electrode being left, and bump 50 with a pointed tip is formed. However, bumps 50 may be formed by any other method, for example, by transferring an electrode with pointed tips to the upper electrode.

Next, insulating layer 30 including insulating layer 31 and insulating layer 32 is formed on the upper surface of lower electrode block 10 (FIG. 5C). Insulating layer 31 is formed so as to surround a periphery of recess 11 and have openings at places corresponding to connection holes 12, 12 of lower electrode block 10. Insulating layer 32 is formed at a place that is rearward of recess 11 and separated from insulating layer 31.

Preferably, insulating layer 31 is, for example, made of an insulating material that primarily contains polyimide and that is hard and actually less deformable. This allows a position of upper electrode block 60 to be stabilized over semiconductor laser element 40 when upper electrode block 60 is attached to lower electrode block 10. Preferably, insulating layer 32 is, for example, made of a soft insulating material that primarily contains aluminum nitride and has high thermal conductivity. The insulating material is, for example, a heat-resistant resin sheet mixed with ceramic powder of aluminum nitride. This provides increased adhesiveness between upper electrode block 60 and insulating layer 32. This also helps heat discharged into upper electrode block 60 to be discharged to heat sink 110 via lower electrode block 10. In other words, the material that makes up insulating layer 32 is softer and higher in thermal conductivity than the material that makes up insulating layer 31.

Upper electrode block 60 having connection holes 61, 61, terminal hole 62, and metal layer 80 is prepared, and metal sheet 70 is inserted between metal layer 80 and bumps 50 (FIG. 5D).

Figure 5E:
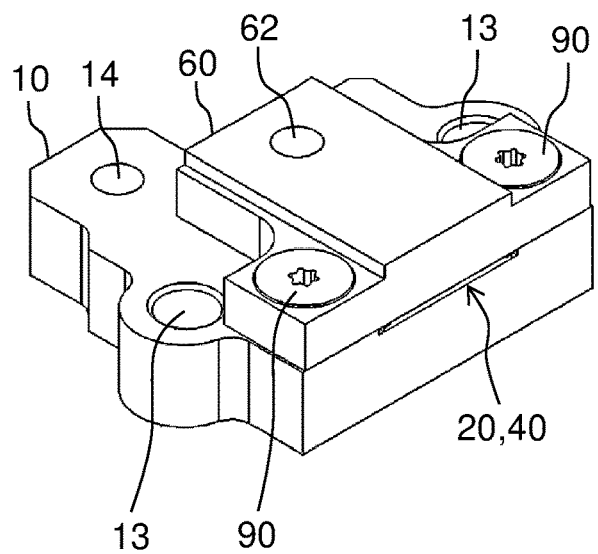
FIG. 5E is a drawing illustrating a step following the step in FIG. 5D.

Alignment is adjusted such that connection holes 12, 12 of lower electrode block 10 overlap connection holes 61, 61 of upper electrode block 60 in a top view, and upper electrode block 60 is disposed over lower electrode block 10. Fasteners 90, 90 are inserted into connection holes 12, 12 and connection holes 61, 61 communicating with connection holes 12, 12, and are screwed into connection holes 12, 12. This fastens lower electrode block 10 and upper electrode block 60 together (FIG. 5E).

Figure 5F:
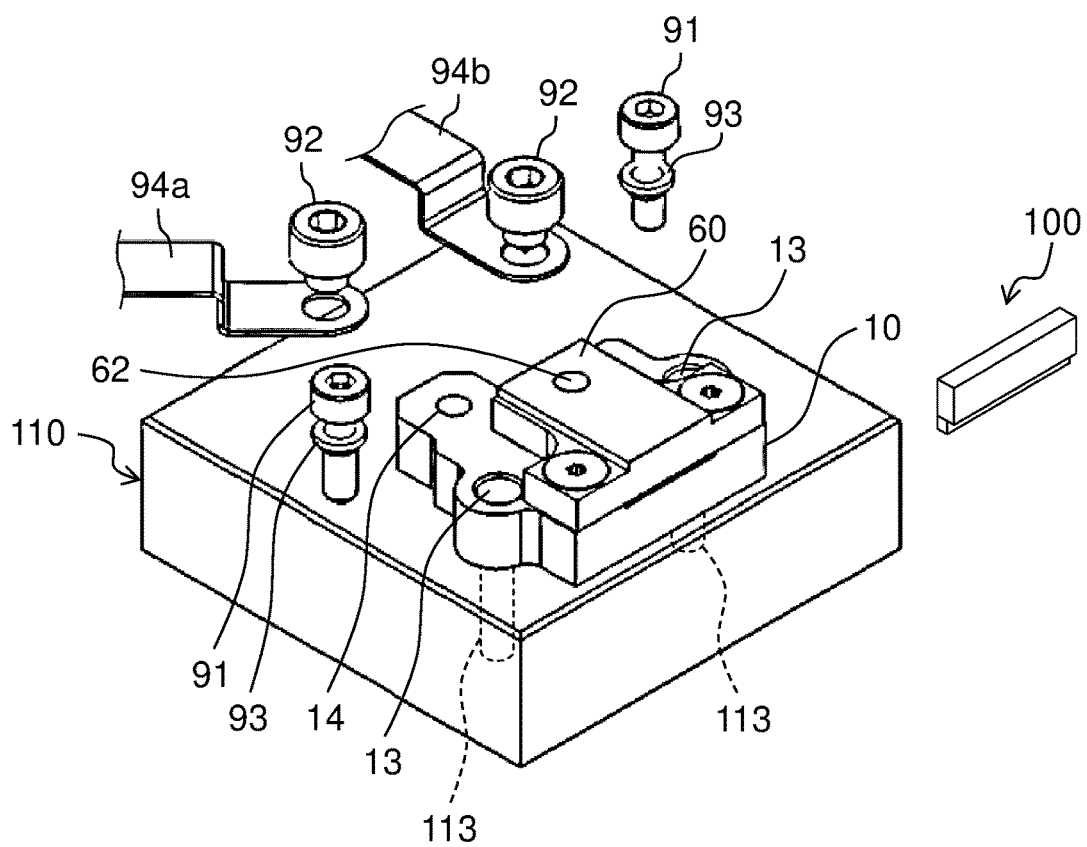
FIG. 5F is a drawing illustrating a step following the step in FIG. 5E.

Heat sink 110 having connection holes 113, 113 is prepared. Alignment is adjusted such that connection holes 13, 13 of lower electrode block 10 overlap connection holes 113, 113 of heat sink 110 in a top view, and lower electrode block 10 is disposed on heat sink 110. Fasteners 91, 91 are inserted into connection holes 13, 13 and connection holes 113, 113 communicating with connection holes 13, 13. One fastener 92 is inserted into the through-hole formed in external terminal 94a as well as into terminal hole 14 in lower electrode block 10. Another fastener 92 is inserted into the through-hole formed in external terminal 94b as well as into terminal hole 62 in upper electrode block 60. Fasteners 91, 91 are screwed into connection holes 113, 113 to fasten lower electrode block 10 to heat sink 110. Fasteners 92, 92 are screwed into terminal hole 14 of lower electrode block 10 and terminal hole 62 of upper electrode block 60, respectively to fasten external terminal 94a to lower electrode block 10 and external terminal 94b to upper electrode block 60 (FIG. 5F).

Figure 5G:
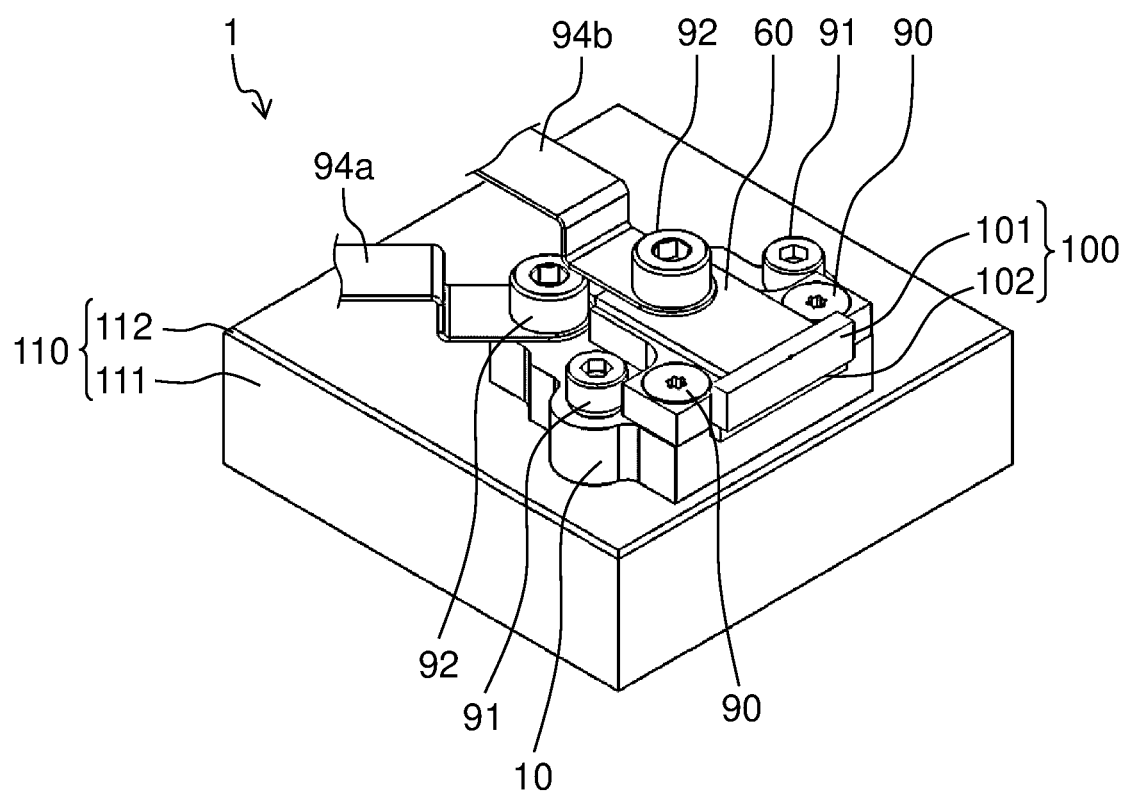
FIG. 5G is a drawing illustrating a step following the step in FIG. 5F.

Next, lens unit 100 in which lens 102 is fixed to holding block 101 is disposed in front of laser emitting edge 40a of semiconductor laser element 40. Electric power is supplied from external terminals 94a, 94b to semiconductor laser element 40 to emit laser light. A position of lens unit 100 is adjusted by adjusting a degree to which fasteners 90, 90 and fasteners 91, 91 are tightened so as to optimize a focus of lens 102. After completion of adjusting the position of lens unit 100, holding block 101 is bonded to the front surface of upper electrode block 60 through an ultraviolet-curable resin. After application or potting of a binding material (not shown) made of an insulating material to fasteners 90, 90 and their surrounding areas and to fasteners 91, 91 and their surrounding areas, the binding material is cured to secure lower electrode block 10, upper electrode block 60, and heat sink 110 and complete the assembly of semiconductor laser device 1 (FIG. 5G). While the focus of lens 102 is being adjusted, lens unit 100 may be temporarily fixed to upper electrode block 60. An insulative binding material (not shown) may be inserted between lower electrode block 10 and upper electrode block 60 to fasten both the electrode blocks together.

In view of heat discharge and mounting of the semiconductor laser device onto a laser machining head or other equipment, contact between heat sink 110 and lower electrode block 10 needs to be firm. This results in an increase in tightening torque for fasteners 91, 91. If three members of lower electrode block 10, upper electrode block 60, and heat sink 110 are fastened together with shared fasteners simultaneously, the members deviate in position from one another in a large degree. This problem becomes more noticeable with an increase in tightening torque for fasteners 91, 91.

In the present exemplary embodiment, connection holes 113, 113 and connection holes 13, 13 for fastening heat sink 110 to lower electrode block 10 and connection holes 12, 12 and connection holes 61, 61 for fastening lower electrode block 10 to upper electrode block 60 are disposed at respective different places. Further, fasteners 90, 90 are inserted into connection holes 12, 12 and connection holes 61, 61 to fasten lower electrode block 10 to upper electrode block 60. Fasteners 91, 91 are inserted into connection holes 113, 113 and connection holes 13, 13 to fasten heat sink 110 to lower electrode block 10. In this way, a process for tightening fasteners 91, 91 to fasten heat sink 110 to lower electrode block 10 is less likely to affect a dispositional relationship between lower electrode block 10 and upper electrode block 60. This prevents the heat sink and the electrode blocks from deviating in position from one another when semiconductor laser device 1 is assembled. This prevents positional deviation between semiconductor laser element 40 attached to lower electrode block 10 and lens 102 attached to upper electrode block 60. As a result, it is possible to adjust the optical axis of laser light to a desired direction and shape the form of the laser light into a desired form.

Lower electrode block 10 and upper electrode block 60 are fastened together with fasteners 90, 90 made of an insulating material. This avoids electrical connection between lower electrode block 10 and upper electrode block 60 through fasteners 90, 90. Lower electrode block 10 and heat sink 110 are fastened together with fasteners 91, 91 made of a metallic material. This provides increased fastening strength between the two members. Bushing 93, 93 inserted between fasteners 91, 91 and lower electrode block 10 electrically insulate fasteners 91, 91 from lower electrode block 10. This avoids electrical connection between heat sink 110 and lower electrode block 10 through fasteners 91, 91.

Figure 6:
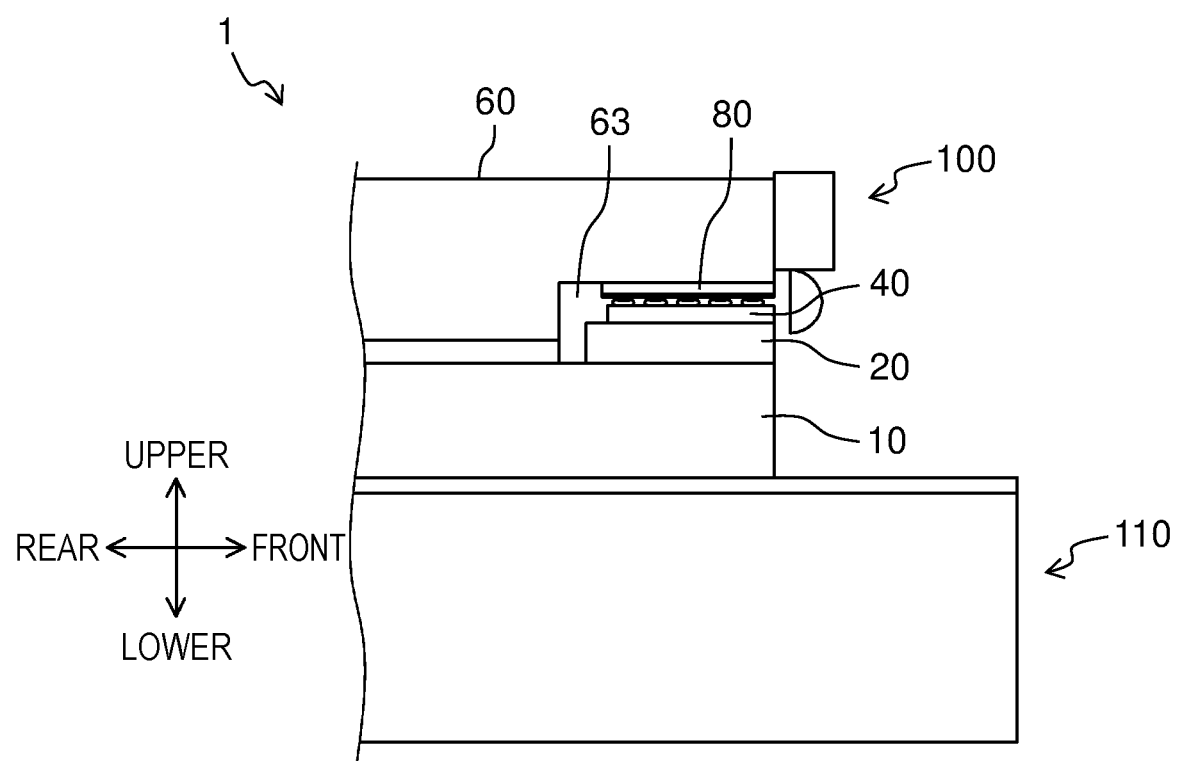
FIG. 6 is a cross-sectional view showing a configuration of another semiconductor laser device according to the exemplary embodiment.

As shown in FIG. 6, recess 63 may be formed in upper electrode block 60 to house semiconductor laser element 40 and submount 20 while no recess is formed in lower electrode block 10. Semiconductor laser element 40 and submount 20 are disposed at a predetermined location (a submount disposition space) on lower electrode block 10 in a vicinity of a front surface of the lower electrode block. A lower surface and a front surface of upper electrode block 60 are partly cut out and opened to form recess 63. Laser light is emitted from semiconductor laser element 40 through a front opening of recess 63. In this case, metal layer 80 is formed on the lower surface of upper electrode block 60 and in recess 63.

No threads are formed on the inner surfaces of connection holes 13, 13 in lower electrode block 10 and of connection holes 61, 61 in upper electrode block 60. If threads are formed on the inner surfaces of connection holes 13, 13 and connection holes 61, 61, the dispositional relationship among the members actually changes in response to tightening of fasteners 90, 90 and fasteners 91, 91 because of a difference such as a machining tolerance difference between these threads and threads that are formed on connection holes 113, 113 and connection holes 12, 12 being located below and communicating with connection holes 13, 13 and connection holes 61, 61.

Modification Example

Figure 7:
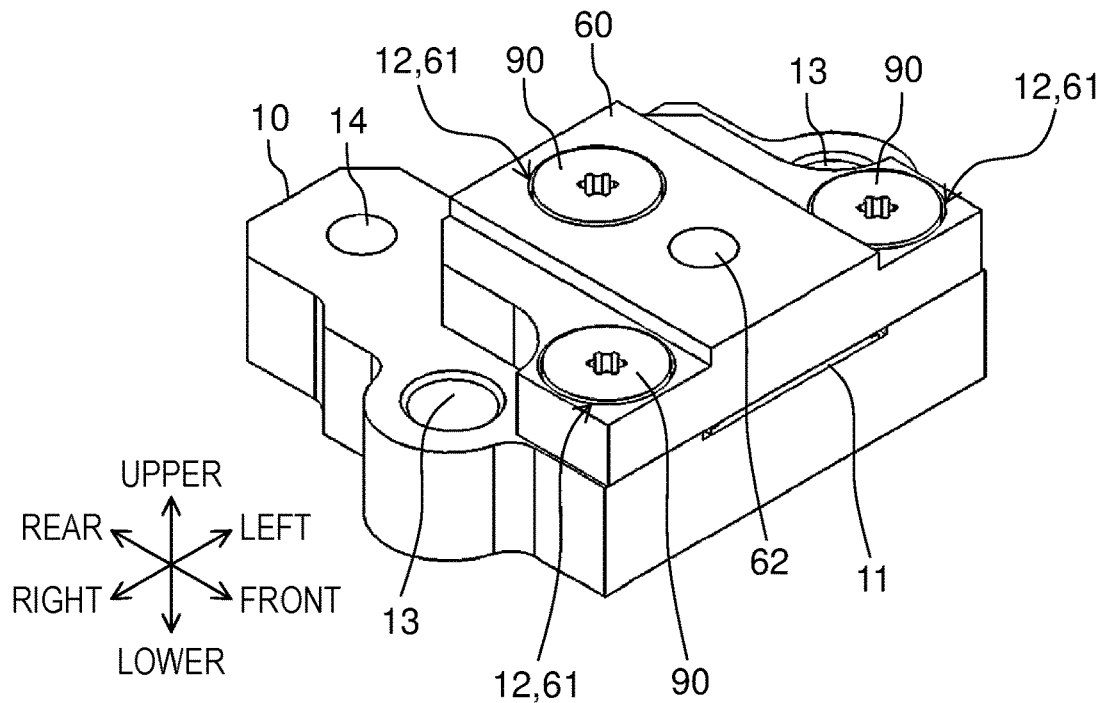
FIG. 7 is a perspective view showing a configuration of a semiconductor laser device according to a modification example.
Figure 8:
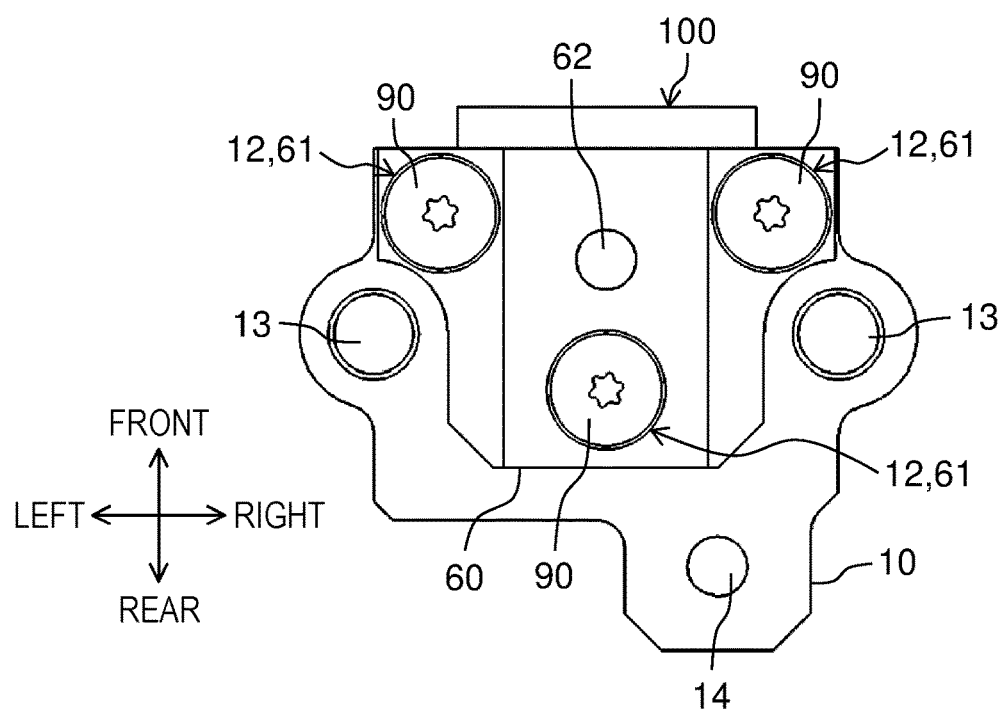
FIG. 8 is a top view showing the configuration of the semiconductor laser device according to the modification example.

FIGS. 7 and 8 are a perspective view and a top view showing a configuration of a semiconductor laser device according to the present modification example. In FIGS. 7 and 8, illustration of heat sink 110, fasteners 91, 91 and 92, 92, and external terminals 94a, 94b is omitted for explanatory convenience.

A difference in configuration between the present modification example and the exemplary embodiment exists in that additional connection hole 12 is formed at one place in lower electrode block 10. Additional connection hole 12 is disposed rearward of connection holes 12, 12 located on both sides of recess 11, i.e., at a place on a side opposite to the side from which laser light is emitted and on a straight line running between these connection holes 12, 12 in a top view. In other words, connection holes 12, 12, 12 are disposed so as to make up apexes of a triangle in the top view. Similarly, additional connection hole 61 is formed at one place in upper electrode block 60. Additional connection hole 61 is disposed rearward of connection holes 61, 61 located on both sides of recess 11, i.e., at a place on a side opposite to the side from which laser light is emitted and on a straight line running between these connection holes 61, 61 in the top view. In other words, connection holes 61, 61, 61 are disposed so as to make up apexes of a triangle in the top view. Further, fastener 90 is inserted into additional connection holes 12, 61. Fasteners 90, 90, 90 are screwed into connection holes 12, 12, 12, and lower electrode block 10 and upper electrode block 60 are thereby fastened together.

In upper electrode block 60, terminal hole 62 is disposed in a vicinity of a barycenter of a triangle joining connection holes 61, 61, 61 in the top view. The vicinity of the barycenter of the triangle includes the barycenter of the triangle and a predetermined area around the barycenter. In the present exemplary embodiment, a case in which the barycenter of the triangle coincides with a center of terminal hole 62 means that terminal hole 62 is disposed at the barycenter of the triangle. A case in which the barycenter of the triangle does not coincide with the center of terminal hole 62 but is located inside terminal hole 62 means that terminal hole 62 is disposed in the predetermined area.

Owing to this configuration, upper electrode block 60 is less likely to deviate in position from lower electrode block 10 when lower electrode block 10 is fastened to upper electrode block 60 with fasteners 90, 90, 90, as well as when external terminal 94b is fastened to upper electrode block 60 with fastener 92. This in turn allows the position of lens unit 100 to be readily adjusted.

In the exemplary embodiments including the modification example described above, one connection hole 13, 13 and one connection hole 12, 12 are formed on each of right and left sides of recess 11 in lower electrode block 10. However, a plurality of holes may be formed on each of right and left sides, with proviso that numbers of the holes formed on the respective right and left sides are identical to each other.

INDUSTRIAL APPLICABILITY

A semiconductor laser device according to the present disclosure is able to prevent positional deviation between a semiconductor laser element attached to a lower electrode block and a lens attached to an upper electrode block. This enables emission of laser light shaped into a desired form. Consequently, the semiconductor laser device can be usefully applied to laser machining devices and other equipment.

REFERENCE MARKS IN THE DRAWINGS

1: semiconductor laser device
10: lower electrode block
11: cutout recess (submount disposition space)
12: connection hole (first connection hole)
13: connection hole (second connection hole)
14: terminal hole (first terminal hole)
20: submount
30: insulating layer
31: insulating layer
32: insulating layer
40: semiconductor laser element
50: bump
60: upper electrode block
61: connection hole (third connection hole)
62: terminal hole (second terminal hole)
63: recess
90: fastener (first fastener)
91: fastener (second fastener)
92: fastener (third fastener)
93: bushing (insulating member)
94a, 94b: external terminal
100: lens unit
101: holding block
102: lens
110: heat sink
112: insulating layer
113: connection hole (fourth connection hole)

The invention claimed is:

1. A semiconductor laser device comprising:
a semiconductor laser element to emit laser light;
a submount electrically connected with the semiconductor laser element disposed on an upper surface of the submount, the submount being made of a conductive material;
a lower electrode block that is disposed below the submount and that is electrically connected with the submount, the lower electrode block having a submount disposition space to allow the submount to be disposed on an upper surface of the lower electrode block, the lower electrode block including
  at least a pair of first connection holes formed on both sides of the submount disposition space,
  a pair of second connection holes formed on both sides of the submount disposition space so as to be separated from the first connection holes, and
  a first terminal hole formed so as to be separated from the submount disposition space and the first and the second connection holes;
an upper electrode block disposed over the lower electrode block so as to cover the submount and the semiconductor laser element, the upper electrode block including
  a pair of third connection holes communicating with the respective first connection holes, and
  a second terminal hole formed so as to be separated from the third connection holes, the upper electrode block being electrically connected with the semiconductor laser element and being electrically insulated from the lower electrode block;
a heat sink having a pair of fourth connection holes communicating with the respective second connection holes, the lower electrode block being disposed on an upper surface of the heat sink; and
an optical component attached to the upper electrode block, the optical component being configured to receive the laser light from the semiconductor laser element,
wherein the lower electrode block and the upper electrode block are fastened together with a pair of first fasteners inserted into the first and the third connection holes,
the lower electrode block and the heat sink are fastened together with a pair of second fasteners inserted into the second and the fourth connection holes,
the semiconductor laser device further comprises a pair of third fasteners made of a conductive material,
the third fasteners are inserted into each of the first and the second terminal holes and are tightened to electrically connect external terminals used to supply electric power to the semiconductor laser element with the lower electrode block and the upper electrode block, respectively,
the upper electrode block includes three of the third connection holes, the three of the third connection holes comprising the pair of the third connection holes and another third connection hole, and
the second terminal hole is disposed in a vicinity of a barycenter of a triangle joining the three of the third connection holes in a top view.

2. The semiconductor laser device according to claim 1, wherein each of the first fasteners is a screw made of an insulating material, and each of the first connection holes is a screw hole into which each of the first fasteners is screwed.

3. The semiconductor laser device according to claim 1, wherein
  each of the second fasteners is a screw made of a metallic material, and each of the fourth connection holes is a screw hole into which each of the second fasteners is screwed, and
  each of the second fasteners is electrically insulated from the lower electrode block with an insulating member.

4. The semiconductor laser device according to claim 1, wherein each of the third fasteners is a screw, and each of the first and the second terminal holes is a screw hole into which the third fasteners are screwed.

5. The semiconductor laser device according to claim 1, wherein the submount disposition space is a cutout recess that is opened in a direction along which the laser light is emitted.

6. The semiconductor laser device according to claim 1, wherein a lower surface of the upper electrode block has a recess to house the submount and the semiconductor laser element.

* * * * *